(12) United States Patent
Stulik et al.

(10) Patent No.: US 7,098,833 B2
(45) Date of Patent: Aug. 29, 2006

(54) TRI-VALUE DECODER CIRCUIT AND METHOD

(75) Inventors: Paul Stulik, Tucson, AZ (US); Hugo Cheung, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/860,979

(22) Filed: Jun. 4, 2004

(65) Prior Publication Data

US 2005/0270184 A1    Dec. 8, 2005

(51) Int. Cl.
  *H03M 1/12* (2006.01)
  *H03M 5/16* (2006.01)
  *H03K 19/00* (2006.01)
  *H03K 19/02* (2006.01)

(52) U.S. Cl. .......................... 341/155; 326/56; 341/57

(58) Field of Classification Search ................ 341/155, 341/57, 118, 120; 326/59, 81, 98, 27, 56, 326/57, 58; 327/203, 211, 218; 365/230.06, 365/241; 710/100; 714/733, 742, 704; 704/219; 702/107
See application file for complete search history.

(56) References Cited

U.S. PATENT DOCUMENTS

| | | | | |
|---|---|---|---|---|
| 3,056,116 A | * | 9/1962 | Crane | 365/241 |
| 3,821,494 A | * | 6/1974 | Besseyre | 370/286 |
| 3,906,255 A | * | 9/1975 | Mensch, Jr. | 326/119 |
| 4,107,549 A | * | 8/1978 | Moufah | 326/59 |
| 4,222,107 A | * | 9/1980 | Mrozowski et al. | 702/107 |
| 4,337,435 A | * | 6/1982 | Munoz | 327/12 |
| 4,531,068 A | * | 7/1985 | Kraft et al. | 326/57 |
| 4,581,550 A | * | 4/1986 | Ferris et al. | 326/56 |
| 4,982,191 A | * | 1/1991 | Ohta | 341/118 |
| 4,992,790 A | * | 2/1991 | Montgomery | 341/70 |
| 5,051,623 A | * | 9/1991 | Yarbrough et al. | 326/56 |
| 5,118,974 A | * | 6/1992 | Yarbrough et al. | 326/56 |
| 5,140,180 A | * | 8/1992 | Crafts et al. | 327/203 |
| 5,198,707 A | * | 3/1993 | Nicolai | 326/98 |
| 5,257,026 A | * | 10/1993 | Thompson et al. | 341/118 |
| 5,450,025 A | * | 9/1995 | Shay | 326/81 |
| 5,513,190 A | * | 4/1996 | Johnson et al. | 714/733 |
| 5,629,634 A | * | 5/1997 | Carl et al. | 326/27 |
| 5,784,575 A | * | 7/1998 | Oakland et al. | 710/100 |
| 5,844,425 A | * | 12/1998 | Nguyen et al. | 326/58 |
| 5,864,244 A | * | 1/1999 | Kaplinsky | 326/58 |
| 5,894,228 A | * | 4/1999 | Reddy et al. | 326/39 |
| 5,914,965 A | * | 6/1999 | Gauthier et al. | 714/704 |
| 6,121,814 A | * | 9/2000 | Henry | 327/291 |
| 6,239,640 B1 | * | 5/2001 | Liao et al. | 327/218 |
| 6,281,708 B1 | * | 8/2001 | Kenny | 326/86 |

(Continued)

*Primary Examiner*—Patrick Wamsley
(74) *Attorney, Agent, or Firm*—W. James Brady, III; Frederick J. Telecky, Jr.

(57) ABSTRACT

A tri-value decoder and method for decoding at least three states of an input signal are provided. An exemplary tri-value decoder and method can facilitate decoding of input signals without the use of threshold values and/or forcing a tri-state input signal to a mid-rail value for tri-state detection, and with less dependence on variations in product, process and temperature. In accordance with an exemplary embodiment, an exemplary tri-value decoder circuit comprises a switch circuit, a feedback loop and a sequence detector. An exemplary switch circuit is configured to facilitate sampling of a tri-state input signal through control by the feedback loop, with the sequence detector configured for decoding the tri-state input signal into a two-bit digital signal by detecting at least two samples of the tri-state input signal during a sampling period.

26 Claims, 6 Drawing Sheets

U.S. PATENT DOCUMENTS

| | | | |
|---|---|---|---|
| 6,346,828 B1 * | 2/2002 | Rosen et al. | 326/56 |
| 6,351,429 B1 * | 2/2002 | Hsu et al. | 365/230.06 |
| 6,418,546 B1 * | 7/2002 | Hartl et al. | 714/742 |
| 6,587,060 B1 * | 7/2003 | Abbey | 341/143 |
| 6,614,276 B1 * | 9/2003 | Robertson et al. | 327/211 |
| 6,710,732 B1 * | 3/2004 | Aude | 341/155 |
| 6,762,637 B1 * | 7/2004 | Raychaudhuri | 327/202 |
| 6,859,387 B1 * | 2/2005 | Aude et al. | 365/155 |
| 6,920,597 B1 * | 7/2005 | Rinderknecht et al. | 714/733 |

* cited by examiner

TRI-VALUE DECODER CIRCUIT AND METHOD

FIELD OF INVENTION

The present invention relates to sampling circuits. More particularly, the present invention relates to a tri-state decoder circuit and method for decoding at least three states of an input signal.

BACKGROUND OF THE INVENTION

The continued demand for improved digital systems for use in a variety of electronic systems and products has resulted in more stringent requirements for such digital systems. For example, modern digital systems must have increased flexibility and reliability, and are expected to require lower power supply levels and higher noise margins. The number of available terminal pins on a digital chip or device often limits the functionality of digital systems. In typical digital systems, each signal pin represents two logical values, namely a logical "0" value and logical "1" value. For increased functionality, a high-impedance state or tri-state assigned a logical value "Z" is introduced, requiring the use of tri-state decoder circuits for the detection of such "Z" value states.

Existing tri-state decoder circuits generally rely on the use of two threshold values, forcing a tri-state input signal to a mid-rail value, and comparing the tri-state input signal to the two threshold values. For example, with reference to FIG. 1, a prior art tri-state decoder circuit 100 comprises a pair of input buffers BUF2 and BUF1 and a digital conditioning circuit 102. Input buffers BUF2 and BUF1 are configured for receiving a tri-state input signal at input pin $SIGNAL_{IN}$, coupled between a resistor divider circuit and between a positive rail supply VDD and ground GND, and for providing an upper and lower threshold respectively, e.g., 0.7 of VDD and 0.3 of VDD. Digital conditioning circuit 102 is configured to receive output signals N2 and N1 from input buffers BUF2 and BUF1 and for providing output signals OUT2 and OUT1. With reference to FIG. 2, another example of an existing tri-state decoder circuit 200 is illustrated. Decoder circuit 200 is similar to decoder circuit 100 except having input buffers BUF2 and BUF1 being replaced with comparators COMP2 and COMP1, respectively, and further configured with a reference divider circuit comprising resistors R3, R4 and R5. The reference divider circuit is configured for generating the upper and lower threshold values, e.g., 0.7 of VDD and 0.3 of VDD.

In both decoder circuits 100 and 200, the values selected for the mid-rail value (VDD/2), and the two threshold values require high precision for correct functionality. For example, with reference to FIG. 3, a diagram illustrating detection margins for facilitating comparison and detection of a tri-state input signal at input pin $SIGNAL_{IN}$ demonstrates that the margin for variation for the mid-rail value VDD/2 (representative of the "Z" state) is relatively small compared to the margins for the upper and lower threshold values, requiring higher precision. The precision is affected by the matching of the various components, as well as process, temperature and power supply variations. For example, resistor mismatch, comparator offset and other like impairments can make high precision difficult to obtain. Further, as the power supply is scaled down for lower power applications, the threshold values and corresponding margins further shrink, requiring even higher precision.

SUMMARY OF THE INVENTION

In accordance with various aspects of the present invention, a tri-state decoder and method for decoding at least three logical values of an input signal are provided. An exemplary tri-value decoder and method can facilitate decoding of input signals without the use of threshold values and/or forcing a tri-state input signal to a mid-rail value for tri-state detection, and with less dependence on variations in product, process, power supply level, or temperature.

In accordance with an exemplary embodiment, an exemplary tri-state decoder circuit comprises a switch circuit, a feedback loop and a sequence detector. An exemplary switch circuit is configured to facilitate sampling of a tri-state input signal through control by the feedback loop, with the sequence detector configured for decoding the tri-state input signal into a two-bit digital signal by detecting at least two samples of the tri-state input signal during a sampling period.

In accordance with an exemplary embodiment, a switch circuit comprises controllable pull-up and pull-down switches that can be configured with or without current-limiting resistors, while a feedback loop can comprise a flip-flop device configured for enabling the pull-up and pull-down switches one at a time to provide a representative sampling sequence. An exemplary sequence detector can comprise various logic configurations for decoding the sampling sequence into a two-bit digital signal.

In accordance with additional exemplary embodiments, an exemplary sequence detector can be configured for detecting three or more samples of the tri-state input signal during a sampling period to provide further reliability and/or error filtering.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 7 illustrates a timing and sequence diagram for an exemplary tri-state decoder circuit in accordance with an exemplary embodiment of the present invention; and FIG. 8 illustrates an exemplary error sequence addressed by an exemplary tri-state decoder circuit in accordance with an exemplary embodimen of the present invention.

DETAILED DESCRIPTION OF EXEMPLARY EMBODIMENTS OF THE INVENTION

The present invention may be described herein in terms of various functional components. It should be appreciated that such functional components may be realized by any number of hardware components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any digital or analog application. However for purposes of illustration only, exemplary embodiments of the present invention will be described herein in connection with decoder circuit as may be used in an analog-to-digital converter (ADC) or digital-to-analog converter (DAC). Further, it should be noted that while various components may be suitably coupled or connected to other components within exemplary circuits, such connections and couplings can be realized by direct connection between components, or by connection through other components and devices located thereinbetween.

In accordance with various aspects of the present invention, a tri-state decoder and method for decoding at least three values of an input signal are provided. An exemplary tri-value decoder and method can facilitate decoding of input signals without the use of threshold values and/or forcing a tri-state input signal to a mid-rail value for comparison to the threshold values for tri-state detection, and with less dependence on variations in product, process, temperature or power supply levels. An exemplary tri-value decoder circuit can be configured within an analog-to-digital converter (ADC), a digital-to-analog converter (DAC), or any other application in which tri-state decoders may be utilized.

Figure 1:
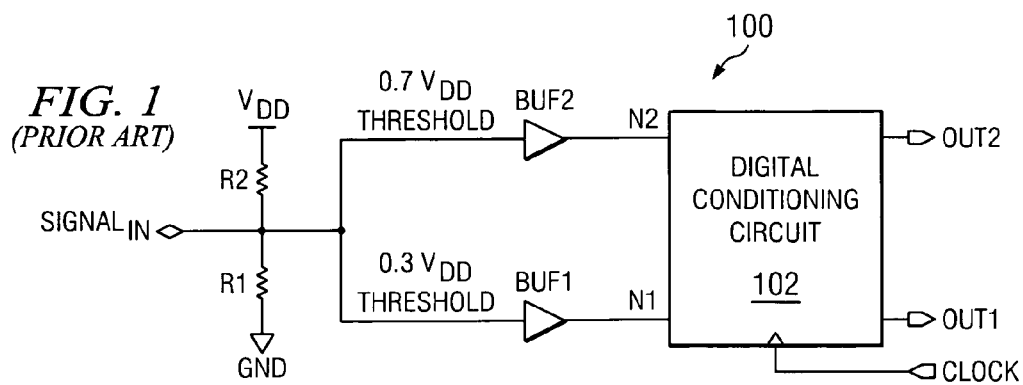
FIG. 1 illustrates a schematic diagram of a prior art tri-state decoder.
Figure 2:
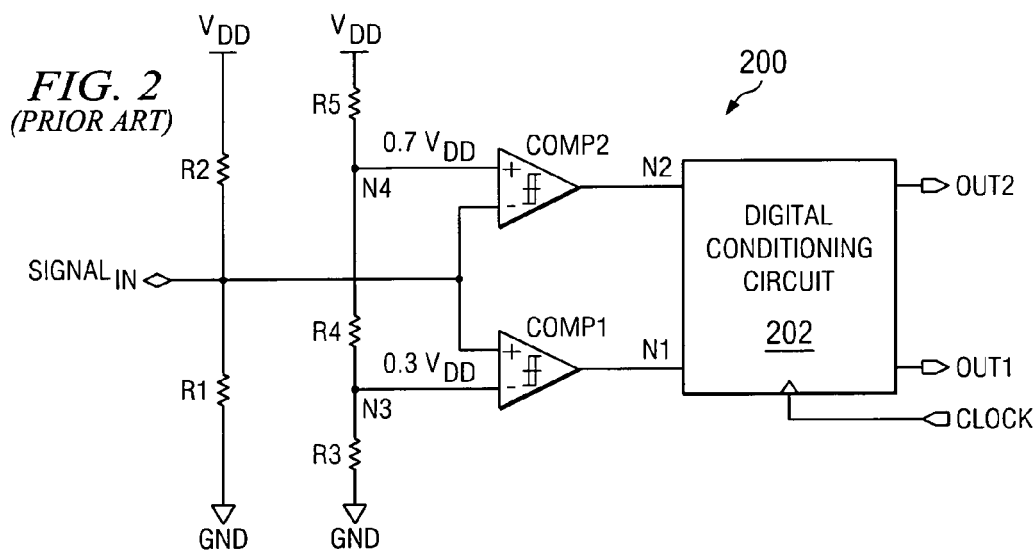
FIG. 2 illustrates a schematic diagram of another prior art tri-state decoder.
Figure 3:
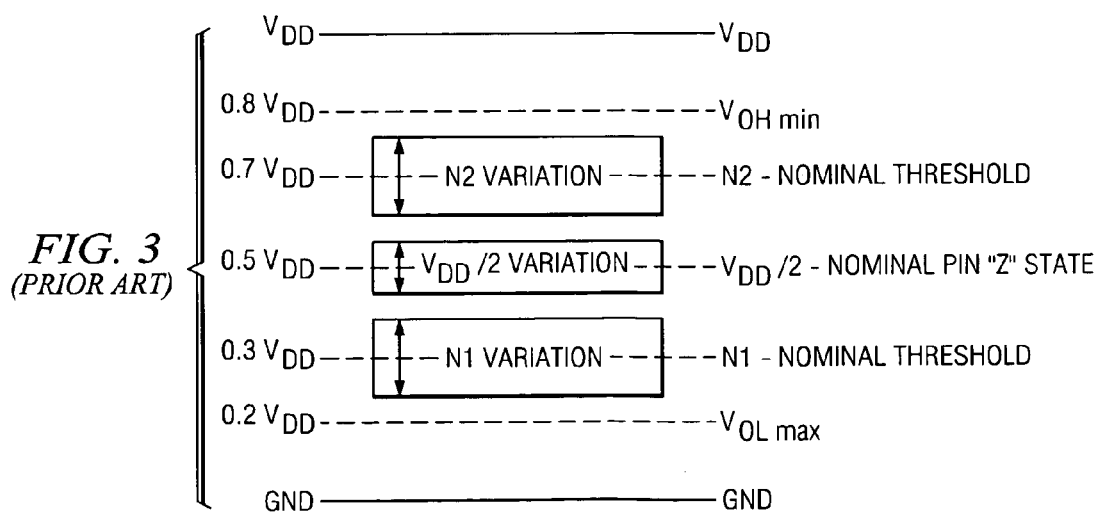
FIG. 3 illustrates a diagram representative of the available detection margins for prior art tri-state decoders.
Figure 4:
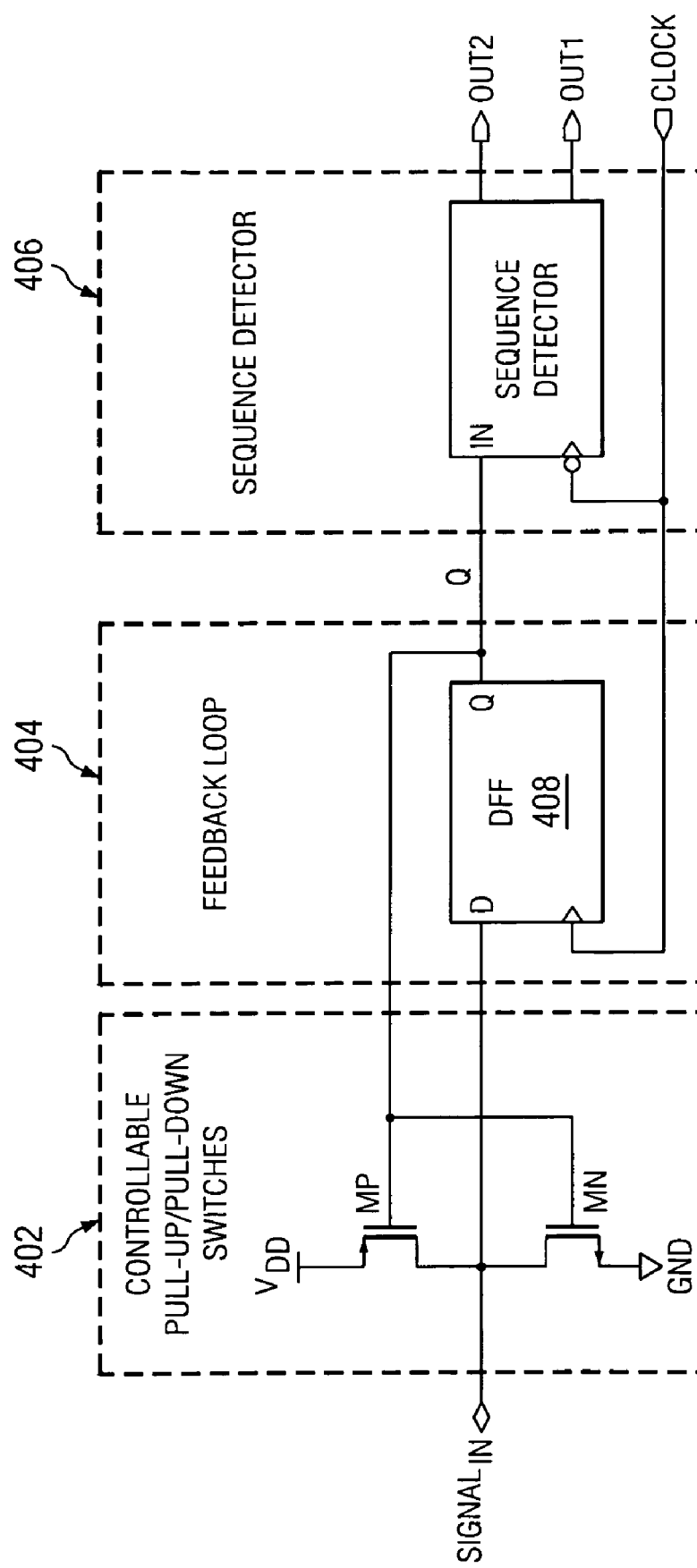
FIG. 4 illustrates a schematic diagram of an exemplary tri-state decoder circuit in accordance with an exemplary embodiment of the present invention.

With reference to FIG. 4 in accordance with an exemplary embodiment, an exemplary tri-state decoder circuit 400 comprises a switch circuit 402, a feedback loop 404 and a sequence detector 406. Switch circuit 402 is configured to facilitate sampling of a tri-state input signal at an input terminal $SIGNAL_{IN}$ through control by feedback loop 404, with sequence detector 406 configured for decoding the tri-state input signal into a two-bit digital signal.

In accordance with an exemplary embodiment, switch circuit 402 comprises controllable pull-up and pull-down switches MP and MN configured in an inverter-like arrangement between an upper supply rail VDD and ground. Switches MP and MN can comprise FET based devices, e.g., with source terminals of transistor devices MP and MN coupled to supply rail VDD and ground, respectively, and with respective drain terminals coupled together to input terminal $SIGNAL_{IN}$. In addition to transistor-based devices, switches MP and MN can comprise any other device or component configured for providing switching functions.

Figure 5:
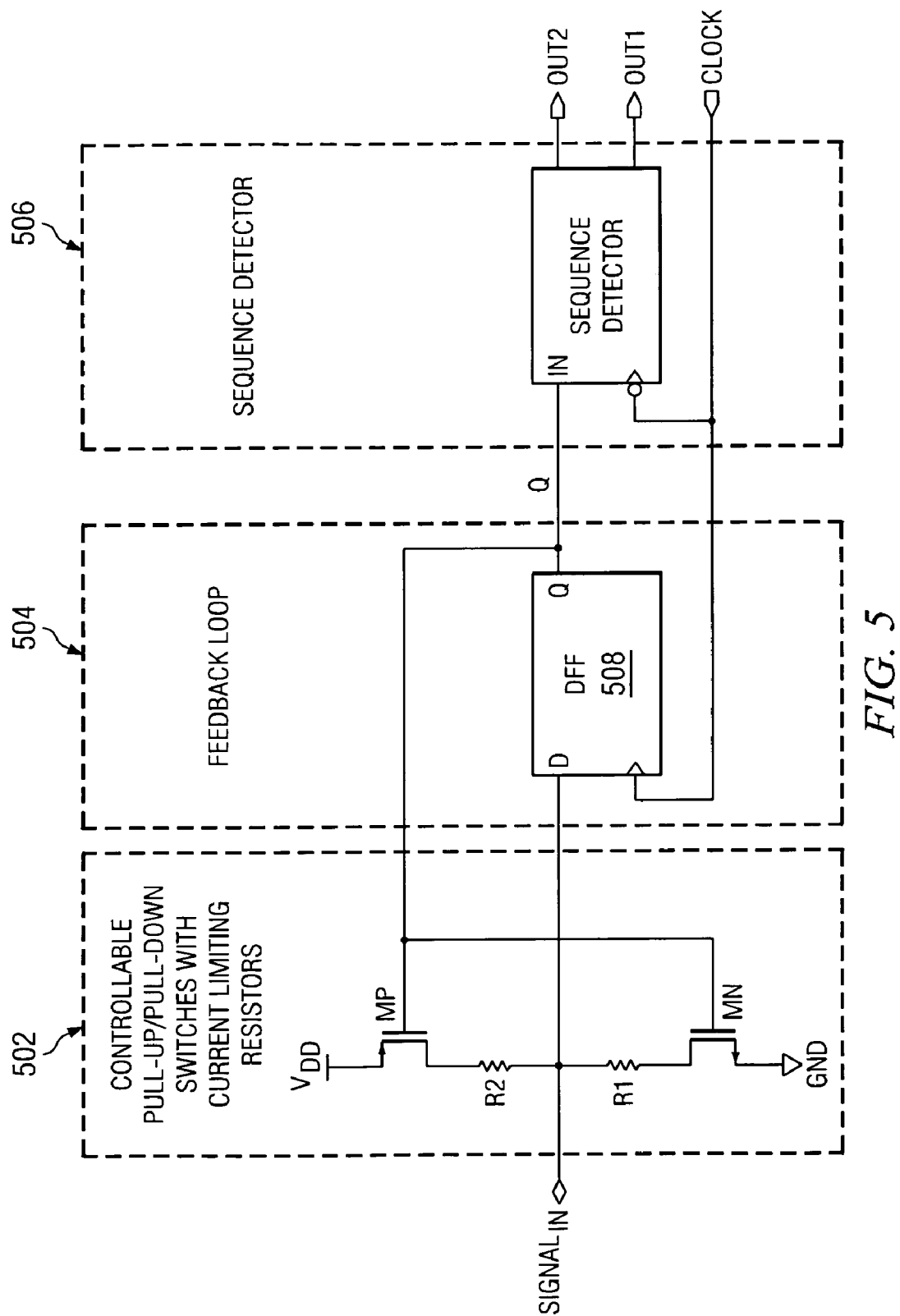
FIG. 5 illustrates a schematic diagram of an exemplary tri-state decoder circuit in accordance with another exemplary embodiment of the present invention.

Switches MP and MN are suitably configured so as not to overpower any tri-state input signal received at input terminal $SIGNAL_{IN}$, e.g., switches MP and MN may be configured as weaker devices with small drive capabilities. Rather than configure as weaker devices with smaller drive capability, in accordance with another exemplary embodiment, switch circuit 402 can also be configured with current-limiting resistors. For example, with momentary reference to FIG. 5, a switch circuit 502 can comprise current-limiting resistors R2 and R1 configured with switches MP and MN. Current-limiting resistors R2 and R1 can enable greater control over switches MP and MN, for example by enabling greater control over the charging and discharging of current to and from any parasitic load capacitances realized at input terminal $SIGNAL_{IN}$, and thus faster switching functions.

Feedback loop 404 is configured for sampling the state of the tri-state input signal received at input terminal $SIGNAL_{IN}$ and for providing a representative sampling sequence for sequence detector 406. Feedback loop suitably enables pull-up switch MP and pull-down switch MN one at a time. For example, if a sampled value at input terminal $SIGNAL_{IN}$ is a "0", then feedback loop 404 enables pull-up switch MP, and if the sampled value at input terminal $SIGNAL_{IN}$ is a "1", then feedback loop 404 enables pull-down switch MN.

In accordance with an exemplary embodiment, feedback loop 404 comprises a delay flip-flop (D flip-flop) device 408 configured for sampling the tri-state input signal at a data input terminal D and providing a delayed output signal at an output terminal Q. Flip-flop device 408 can comprise an edge-triggered device, e.g., a D flip-flop configured to provide a change in the state of output signal Q at the occurrence of a rising edge or at a falling edge of a clock signal. The output signal at terminal Q is coupled in a feedback configuration to the gate terminals of pull-up switch MP and pull-down switch MN to suitably enable switches MP and MN based on the sampled value at terminal D. In addition, D flip-flop device 408 can be suitably clocked through a clock signal CLOCK.

During operation, when the tri-state input signal at input terminal $SIGNAL_{IN}$ is sampled as a "0" by terminal D, output Q will follow with a "0" value after an edge-triggered delay, thus turning on pull-up switch MP and pulling input terminal $SIGNAL_{IN}$ high. As long as the sampled signal remains a "0", a sampled sequence of "0, 0, 0, 0, 0 . . . " will be realized. In the event the tri-state input signal at input terminal $SIGNAL_{IN}$ is sampled as a "1" by terminal D, output Q will also follow with a "1" value after an edge-triggered delay, thus enabling pull-down switch MN and pulling input terminal $SIGNAL_{IN}$ down. As long as the sampled signal remains a "1", a sampled sequence of "1, 1, 1, 1, 1 . . . " will be realized.

In the event the tri-state input signal is in high impedance "Z" state, switches MP and MN will be enabled sequentially. For example, during one sample period, pull-up switch MP will be enabled, thus pulling input terminal $SIGNAL_{IN}$ high, and logic "1" will be sampled for the sampling period. During the next sample period, pull-down switch MN will be enabled, thus pulling down input terminal $SIGNAL_{IN}$, and logic "0" will be sampled for the sampling period. As long as the sampled signal remains in high impedance "Z" state, a sampled sequence of "1, 0, 1, 0, 1, 0 . . . " will be realized. High impedance "Z" state can also be realized through a sampled sequence of "0, 1, 0, 1, 0, 1 . . . "

While feedback loop 404 can comprise a single D flip-flop device 408 for facilitating control of switch circuit 402, feedback loop 404 can comprise other configurations. For example, feedback loop 404 can comprise different flip-flop device configurations and/or additional flip-flop devices. Moreover, feedback loop 404 can comprise any other logic configuration for facilitating control of switch circuit 402 and for providing a representative sampling sequence for sequence detector 406.

Sequence detector 406 is configured for receiving a sampling sequence from feedback loop 404 at an input terminal IN and for providing a two-bit digital signal at output terminals OUT2 and OUT1. Sequence detector 406 can also be suitably clocked through clock signal CLOCK. Depending on which of the above three sequences are detected, sequence detector 406 provides a two-bit digital signal representing a logical "0", "1" or "Z" state at input terminal SIGNAL$_{IN}$.

An exemplary sequence detector 406 can comprise various logic configurations for decoding the sampling sequence into a two-bit digital signal. For example, sequence detector 406 can be configured for decoding the tri-state input signal into a two-bit digital signal by detecting at least two samples of the tri-state input signal during a sampling period. Decoding a tri-state signal with at least two samples is necessary to determine whether it is in a low state "0" (0, 0), a high state "1" (1, 1) or a high impedance state "Z" (1,0 or 0,1). For greater reliability, in accordance with additional exemplary embodiments, an exemplary sequence detector can be configured for detecting three or more samples of the tri-state input signal during a sampling period to provide further reliability and/or error filtering.

Figure 6A:
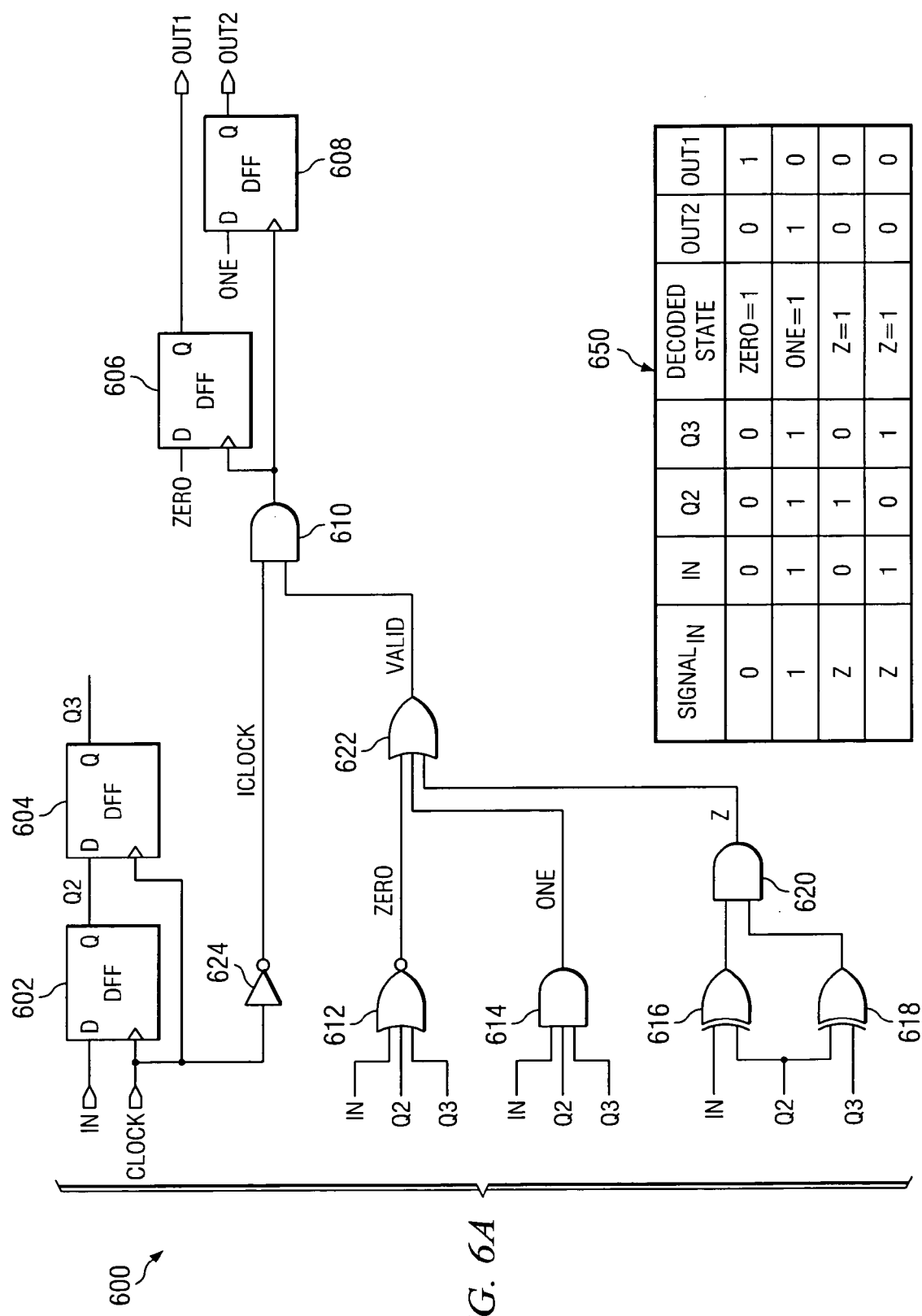
FIGS. 6A and 6B illustrate schematic diagrams of exemplary logic for a sequence detector circuit in accordance with an exemplary embodiment of the present invention.

For example, with reference to FIG. 6A, an exemplary sequence detector 600 is configured for detecting three samples of the tri-state input signal during a sampling period. Sequence detector 600 comprises D flip-flop devices 602, 604, 606 and 608. Flip-flop device 602 is configured to sample the delayed signal IN, representative of a delayed output signal provided by a D flip-flop within feedback loop 404, and provide a delayed output Q2, while flip-flop device 604 is configured to sample delayed output Q2 and provide a delayed output Q3, thus allowing for at least three samples to be decoded before sequence detector 600 provides an output signal. Flip-flop devices 602 and 604 can be suitably triggered by clock signal CLOCK.

Flip-flop devices 606 and 608 are configured to provide a hold or memory function for sequence detector 600. Flip-flop device 606 provides a delayed output signal at OUT1, i.e., as one bit in the two-bit digital output signal of detector 600, while flip-flop device 608 provides a delayed output signal at OUT2, i.e., as the second bit in the two-bit digital output signal of detector 600. An inverted clock signal ICLOCK is provided by an inverter 624 to an AND gate 610, with the output being further configured to trigger flip-flop devices 606 and 608 when both input terminals to AND gate 610 are in a "high" state.

To confirm whether outputs OUT1 and OUT2 are providing reliable output signals, sequence detector 600 further comprises additional logic devices for providing a validity signal VALID to AND gate 610. In the exemplary embodiment of FIG. 6A, sequence detector 600 comprises a NOR gate 612, an AND gate 614, and XOR gates 616 and 618 configured to receive signals IN, Q2 and Q3. For example, signals IN, Q2 and Q3 are sampled by NOR gate 612 and AND gate 614, signals IN and Q2 are sampled by XOR gate 616, and signals Q2 and Q3 are sampled by XOR gate 618. The output signals of NOR gate 612 and AND gate 614 can be received by an OR gate 622, while the output signals of XOR gates 616 and 618 are first received by an AND gate 620 to provide an output signal also being received by OR gate 622. The output signal of NOR gate 612 represents that a detected "zero" state is valid, the output signal of AND gate 614 represents that a detected "one" state is valid, and the output signal of AND gate 620 represents that a detected "Z" state is valid. In addition, the output signal of NOR gate 612 is suitably coupled to the input terminal of flip-flop 606, while the output signal of AND gate 614 is coupled to the input terminal of flip-flop 608.

Thus, for example, with reference to a logic table 650, for a "0" value tri-state input signal, a "0" will appear at input terminal IN of flip-flop 602 and eventually at delayed output signals Q2 and Q3, resulting in the output of NOR gate 612 in a "high" state, i.e., representing a decoded state of ZERO=1, and with output-bit signals OUT2 and OUT1 providing "0" and "1" states, respectively, thus indicating a decoded "0" value for the detected tri-state signal. For a "1" value tri-state input signal, a "1" will appear at input terminal IN of flip-flop 602 and eventually at delayed output signals Q2 and Q3, resulting in the output of AND gate 614 in a "high" state, i.e., representing a decoded state of ONE=1, and with output-bit signals OUT2 and OUT1 providing "1" and "0" states, respectively, thus indicating a decoded "1" value for the tri-state signal. Finally, for a "Z" value tri-state input signal, either a "0" will appear at input terminal IN of flip-flop 602, followed by a "1" and "0" at delayed output signals Q2 and Q3, respectively, or a "1" will appear at input terminal IN of flip-flop 602, followed by a "0" and "1" at delay output signals Q2 and Q3, respectively; as a result, the output of AND gate 620 will be in a "high" state, i.e., representing a decoded state of Z=1, and both of output-bit signals OUT2 and OUT1 providing "0" states, indicating a decoded "Z" value for the tri-state signal.

Figures 7, 8:
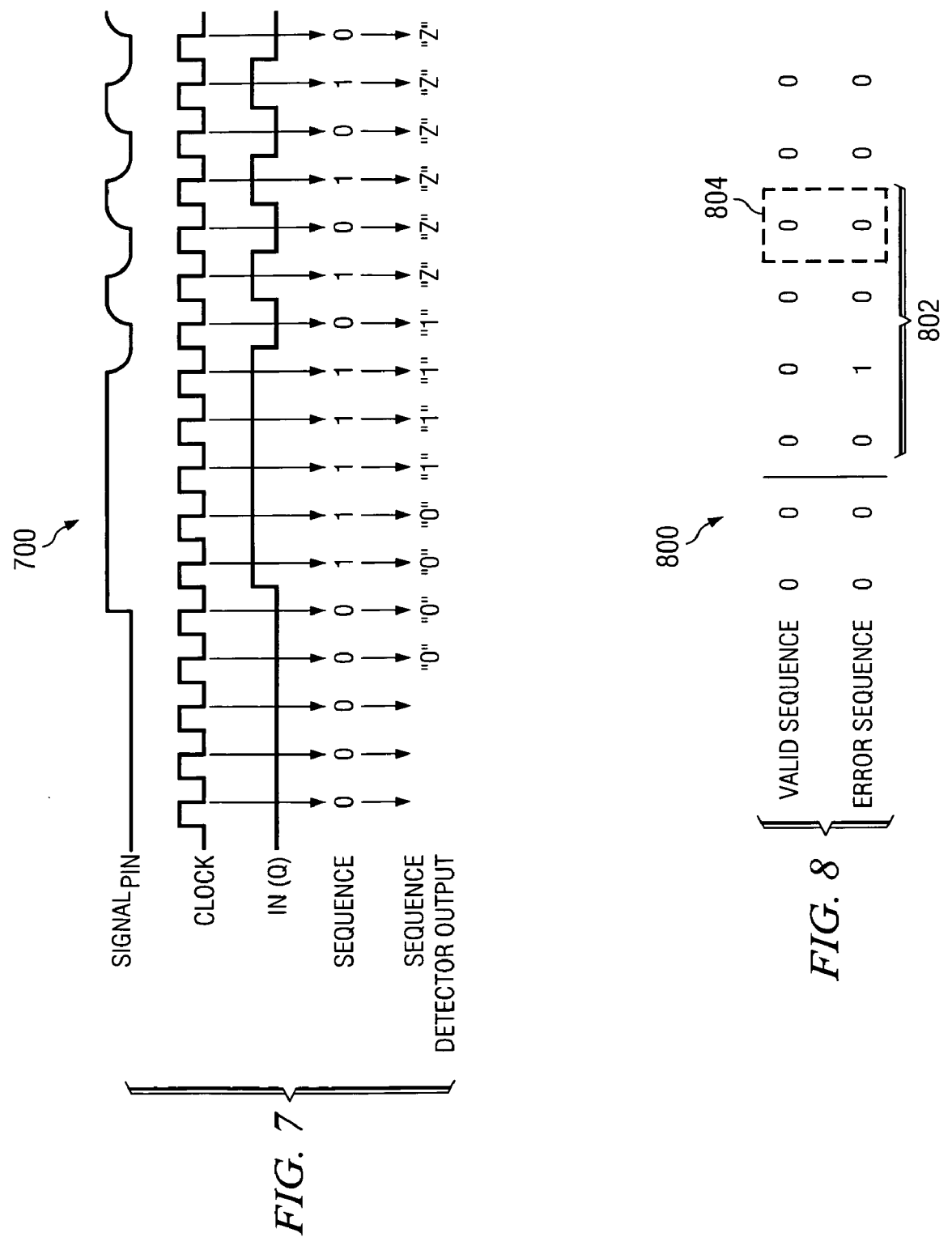

Accordingly, with additional reference to FIG. 7, an exemplary timing diagram 700 illustrates that for a "0" valued tri-state input signal at input terminal SIGNAL$_{IN}$, an input signal IN to sequence detector 600 will remain "low" until a rising edge of a clock cycle before sequencing "high". However, a sampling sequence will suitably wait until a falling edge occurs before changing, i.e., before SEQUENCE=1. In addition, the output of sequence detector 600 will remain unchanged until three samples are obtained. Thus, for example, after three clock cycles in which input signal IN is "high", the output of sequence detector 600 will change to a "1", indicating a decoded "1" value for the tri-state signal. Accordingly, sequence detector 600 suitably reads three samples at a time in order to decode a tri-state input signal. In addition, a "Z" state condition realizes substantially the same noise margin as the "0" and "1" state conditions, thus enabling sequence detector 600 to be substantially immune to shrinking power supply levels.

An exemplary sequence detector 600 illustrated in FIG. 6A can facilitate very reliable results so long as the tri-state input signals being sampled are valid sequences. However, in the event that sampling glitches are generated, it is possible for sequence detector 600 to decode such glitch signals incorrectly. For example, with momentary reference to a sequence diagram 800 illustrated in FIG. 8, by monitoring the first three samples "0, 0, 0, 0 . . . " of a valid sequence 802, sequence detector 600 can suitably decode the sampled sequence to provide a "0" state; however, by monitoring the first three samples for an error sequence of "0, 1, 0, 0 . . . ", sequence detector 600 can incorrectly provide a decoded "Z" state. To address such errors, in accordance with another exemplary embodiment, sequence detector 600 can be configured with error-filtering functions to substantially eliminate the decoding of signals in error.

Figure 6B:
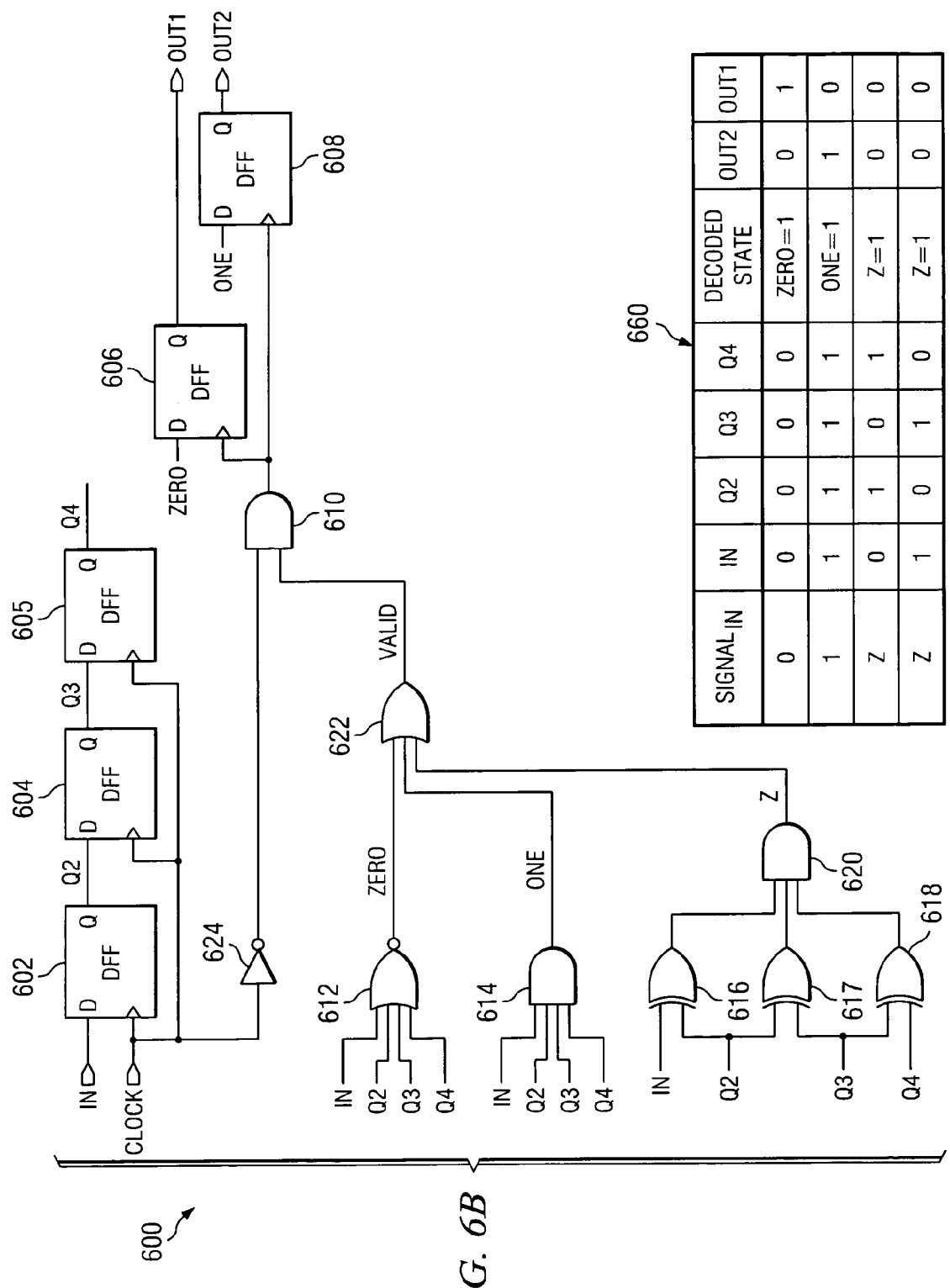

For example, an exemplary sequence detector 600 can be configured with one or more additional flip-flop devices to provide additional delayed sample outputs. With reference to FIG. 6B, exemplary sequence detector 600 can be configured with an additional D flip-flop 605 configured to sample delayed output Q3 and provide a delayed output Q4, thus allowing for at least four samples to be decoded before sequence detector provides an output signal. Flip-flop device 605 can also be suitably triggered by clock signal CLOCK. Additional delayed output signal Q4 can be further provided as a delayed input signal to NOR gate 612, AND gate 614, and XOR gate 618 (with delayed output signal Q2 being provided to XOR gate 616 and an additional XOR gate 617, but not XOR gate 618). Additional XOR gate 617 is introduced to prevent the decoding of an invalid sequent of "0, 1, 1, 0" or "1, 0, 0, 1" as a valid "Z" state. Thus, with reference to a logic table 660, in the event input signal IN and delayed output Q2 are in different states, e.g., a "0" state and a "1" state, and delayed output Q3 and delayed output Q4 are also in different states, e.g., a "0" state and a "1" state, then the output signal of AND gate 620 will be a "1", i.e., a decoded state Z=1, resulting in output signals OUT1 and OUT2 providing "0" states, indicative of a "Z" state for a tri-state input signal.

Thus, with momentary reference again to FIG. 8, for an error sequence of "0, 1, 0, 0 . . . ", a fourth sample 804 as facilitated by delayed output Q4 of flip-flop 605 can allow sequence detector 600 to determine that the sequence does not represent a decoded "Z" state, but instead the "1" state is a glitch-sample, and thus the decoded state should remain "0" for the output signal of sequence detector 600.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by replacing the FET-based switches with bipolar devices. Moreover, additional sample signals can be read at a time by a sequence detector, such as by adding another flip-flop device to receive delayed output Q4 and provide a delayed output Q5, or any other number of additional flip-flop devices and delayed output signals QN. These alternatives can be suitably selected depending upon the particular application or in consideration of any number of factors associated with the operation of the system. Moreover, these and other changes or modifications are intended to be included within the scope of the present invention, as expressed in the following claims.

The Invention claimed is:

1. A tri-state decoder circuit configured to decode an input signal, said tri-state decoder circuit comprising:
   a switch circuit configured to facilitate sampling of the input signal;
   a feedback loop configured for control of the switch circuit; and
   a sequence detector for decoding a sampled sequence to provide a digital output signal.

2. The tri-state decoder circuit according to claim 1, wherein said sequence detector comprises:
   a first flip-flop device and a second flip-flop device for receiving a sample signal and for providing at least two delayed output signals;
   a hold memory logic circuit configured for providing a two-bit digital signal; and
   a validity logic circuit configured for providing a valid signal for clocking said hold memory logic circuit and for providing logic sample signals to said hold memory circuit.

3. The tri-state decoder circuit according to claim 2, wherein said hold memory circuit comprises a third flip-flop configured for facilitating detection of a "zero" state and a fourth flip-flop configured for facilitating detection of a "one" state.

4. The tri-state decoder circuit according to claim 3, wherein said sequence detector comprises a fifth flip-flop device for providing an error-filtering function, said fifth flip-flop configured for receiving a delayed output signal from said second flip-flop device and for providing a third delayed output signal.

5. The tri-state decoder circuit according to claim 2, wherein said validity logic circuit comprises a NOR gate, a first AND gate, and a pair of XOR gates configured for sampling said sample signal and said at least two delayed output signals, a second AND gate for receiving output signals from said pair of XOR gates, and an OR gate configured for receiving output signals from said AND gate.

6. The tri-state decoder circuit according to claim 1, wherein said switch circuit comprises a controllable pull-up switch and a controllable pull-down switch.

7. The tri-state decoder circuit according to claim 6, wherein said pull-up switch and said pull-down switch are configured with current-limiting resistors.

8. The tri-state decoder circuit according to claim 6, wherein said pull-up switch comprises a PNP-based FET transistor and said pull-down switch comprises a NPN-based FET transistor.

9. The tri-state decoder circuit according to claim 1, wherein said feedback loop comprises a flip-flop device configured for providing said sampled sequence.

10. The tri-state decoder circuit according to claim 9, wherein said feedback loop comprises an edge-triggered, delay flip-flop device.

11. The tri-state decoder circuit according to claim 9, wherein said flip-flop device comprises an output signal configured to enable operation of a controllable pull-up switch and a controllable pull-down switch of said switch circuit.

12. The tri-state decoder circuit according to claim 1, wherein said sequence detector comprises a plurality of logic devices for decoding said sampled sequence.

13. An analog-to-digital converter circuit comprising a tri-state decoder circuit configured to decode a tri-value input signal, said tri-state decoder circuit comprising:
   a switch circuit comprising a pair of controllable switches;
   a feedback loop configured for control of said pair of switches, and for providing a sampling sequence; and
   a sequence detector configured for decoding said sampling sequence to provide a two-bit digital output signal.

14. The analog-to-digital converter circuit according to claim 13, wherein said sequence detector comprises:
   a first flip-flop device and a second flip-flop device for receiving a sample signal and for providing at least two delayed output signals;
   a hold memory logic circuit configured for providing a two-bit digital signal; and
   a validity logic circuit configured for providing a valid signal for clocking said hold memory logic circuit and for providing logic sample signals to said hold memory circuit.

15. The analog-to-digital converter circuit according to claim 14, wherein said validity logic circuit comprises a NOR gate, first AND gate, and a pair of XOR gates configured for sampling said sample signal and said at least two delayed output signals.

16. The analog-to-digital converter circuit according to claim 15, wherein said validity logic circuit further comprises a second AND gate for receiving output signals from said pair of XOR gates, and an OR gate configured for receiving output signals from said AND gate.

17. The analog-to-digital converter circuit according to claim 14, wherein said hold memory circuit comprises a third flip-flop configured for facilitating detection of a "zero" state and a fourth flip-flop configured for facilitating detection of a "one" state.

18. The analog-to-digital converter circuit according to claim 13, wherein said decoder circuit includes a pull-up switch and a pull-down switch being configured with current-limiting resistors.

19. The analog-to-digital converter circuit according to claim 18, wherein said pull-up switch comprises a PNP-based FET transistor and said pull-down switch comprises a NPN-based FET transistor.

20. The analog-to-digital converter circuit according to claim 13, wherein said feedback loop comprises an edge-triggered, delay flip-flop device.

21. The analog-to-digital converter circuit according to claim 20, wherein said tri-state decoder circuit further comprises said flip-flop device having an output signal configured to enable operation of a controllable pull-up switch and a controllable pull-down switch of said switch circuit.

22. A method for decoding a tri-state signal, said method comprising:
receiving through a switch circuit the tri-state signal;
controlling said switch circuit through a feedback loop to sample said tri-state signal;
generating a delayed sample signal from said feedback loop; and
decoding in a sequence detector at least two delayed sample signals to determine a logic value for said tri-state signal.

23. The method according to claim 22, wherein said generating said delayed sample comprises sampling said tri-state signal with an edge-triggered, delay flip-flop.

24. The method according to claim 23, wherein said decoding comprises generating a validity signal and providing a hold memory function to decode said tri-state signal.

25. The method according to claim 22, wherein said decoding comprises decoding in said sequence detector at least three delayed sample signals.

26. A tri-state decoder circuit comprising:
a switch circuit comprising a pull-up switch and a pull-down switch;
a flip-flop device configured in a feedback loop for control of said pull-up switch and said pull-down switch; and
a sequence detector configured for decoding samples from said flip-flop device to provide a decoded tri-state signal.

* * * * *